(12) United States Patent
Li et al.

(10) Patent No.: US 9,824,865 B2
(45) Date of Patent: Nov. 21, 2017

(54) WAFERLESS CLEAN IN DIELECTRIC ETCH PROCESS

(71) Applicant: Lam Research Corporation, Fremont, CA (US)

(72) Inventors: Shijian Li, San Jose, CA (US); David Carman, San Jose, CA (US); Chander Radhakrishnan, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 760 days.

(21) Appl. No.: 14/198,532

(22) Filed: Mar. 5, 2014

(65) Prior Publication Data

US 2015/0255259 A1    Sep. 10, 2015

(51) Int. Cl.
*H01J 37/32*  (2006.01)

(52) U.S. Cl.
CPC .. *H01J 37/32862* (2013.01); *H01J 37/32091* (2013.01); *H01J 37/32477* (2013.01); *H01J 37/32724* (2013.01); *H01J 37/32853* (2013.01); *H01J 37/32926* (2013.01); *H01J 2237/334* (2013.01); *H01J 2237/335* (2013.01)

(58) Field of Classification Search
CPC ........... H01J 37/32091; H01J 37/32862; H01J 37/32926; H01J 37/32853; H01J 2237/335; H01J 37/32477; H01J 37/32724; H01J 2237/334
See application file for complete search history.

(56) References Cited

U.S. PATENT DOCUMENTS

| 5,756,400 A * | 5/1998 | Ye | B08B 7/0042 134/1.1 |
|---|---|---|---|
| 2005/0224458 A1* | 10/2005 | Gaudet | B08B 7/0035 216/67 |
| 2009/0139540 A1* | 6/2009 | Lau | B08B 7/0035 134/1.1 |
| 2011/0048453 A1 | 3/2011 | Honda et al. | |

FOREIGN PATENT DOCUMENTS

CN            102789960 A  * 11/2012

* cited by examiner

*Primary Examiner* — Alexander Markoff
(74) *Attorney, Agent, or Firm* — Martine Penilla Group, LLP (57) ABSTRACT

A system and method for a waferless cleaning method for a capacitive coupled plasma system. The method includes forming a protective layer on a top surface of an electrostatic chuck, volatilizing etch byproducts deposited on one or more inner surfaces of the plasma process chamber, removing volatilized etch byproducts from the plasma process chamber and removing the protective layer from the top surface of the electrostatic chuck. A capacitive coupled plasma system including a waferless cleaning recipe is also described.

18 Claims, 4 Drawing Sheets

WAFERLESS CLEAN IN DIELECTRIC ETCH PROCESS

BACKGROUND

The present invention relates generally to semiconductor etch processes, and more particularly, to methods and systems for cleaning the etch process chamber.

Semiconductor wafers are typically placed in an etch chamber with a photoresist mask layer to direct the etch of the underlying materials. The etching process removes the underlying materials not covered by the photoresist. The etch process also removes a portion of the photoresist.

The etch byproducts including mixtures of the etchant chemicals, the photoresist and the underlying materials, condense on the walls and any other surface within the etch process chamber. Typically, an oxygen based plasma waferless cleaning process is used to volatilize the etch byproducts. The volatilized etch byproducts can then be evacuated or purged from the etch process chamber.

As the device sizes have become smaller, the materials in the mask layer have changed to hard mask materials including metals such as titanium and others. The titanium in the mask layer is etched away from the wafer and condensed on the walls and other surfaces within the etch process chamber. However, the oxygen based plasma waferless cleaning process is very slow and inefficient at volatilizing the titanium containing residue from the inner surfaces of the etch process chamber. As a result, the titanium containing etch byproducts tend to build up on the inner surfaces of the etch process chamber. Eventually, the titanium containing etch byproducts can flake off the inner surfaces of the etch process chamber and cause excessive particles on the wafer.

There is a need for a more efficient waferless cleaning process that will effectively remove the deposited mixture of titanium, photoresist and underlying materials without damaging the surfaces and devices within the etch process chamber.

SUMMARY

Broadly speaking, the present invention fills these needs by an improved waferless auto clean process. It should be appreciated that the present invention can be implemented in numerous ways, including as a process, an apparatus, a system, computer readable media, or a device. Several inventive embodiments of the present invention are described below.

One embodiment provides a waferless cleaning method for a capacitive coupled plasma system. The method includes forming a protective layer on a top surface of an electrostatic chuck, volatilizing etch byproducts deposited on one or more inner surfaces of the plasma process chamber, removing volatilized etch byproducts from the plasma process chamber and removing the protective layer from the top surface of the electrostatic chuck.

Forming the protective layer on the top surface of the electrostatic chuck can include providing a process gas into the plasma process chamber and forming a plasma with the process gas. The electrostatic chuck can be maintained at a temperature less than the edge ring such as maintaining the edge ring at between about 20 and about 200 degrees C. hotter than the electrostatic chuck and/or maintaining the electrostatic chuck at a temperature of between about −40 to about 150 degrees C. Volatilizing etch byproducts deposited on the one or more inner surfaces of the plasma process chamber can include forming volatile compounds of the etch byproducts with the process gas.

Forming the protective layer on the top surface of the electrostatic chuck can include providing a first process gas into the plasma process chamber, forming a plasma with the first process gas. Volatilizing etch byproducts deposited on the one or more inner surfaces of the plasma process chamber can include providing a second process gas into the plasma process chamber, forming a plasma with the second process gas and forming volatile compounds of the etch byproducts with the second process gas. The second process gas can have a lower carbon to fluorine ratio than the first process gas. Providing the first process gas can end before providing the second process gas. Alternatively, providing the second process gas can overlap providing the first process gas.

Removing the volatilized etch byproducts from the plasma process chamber can include pumping the volatilized etch byproducts out of the plasma process chamber using a pump coupled to an outlet of the plasma process chamber. Removing the volatilized etch byproducts from the plasma process chamber can also or alternatively include purging the plasma process chamber with a purge gas.

Removing the protective layer from the top surface of the electrostatic chuck can include providing a third process gas into the plasma process chamber, the third process gas including oxygen or oxygen containing compounds, forming a volatile compound of the protective layer and removing the volatile compound of the protective layer from the plasma process chamber. The one or more inner surfaces of the plasma process chamber can include one or more portions of an edge ring such as a portion of the edge ring that would be shadowed by a wafer, if the wafer were present to be processed in the plasma process chamber.

Another embodiment provides a capacitive coupled plasma system including a plasma process chamber. The plasma process chamber includes an electrostatic chuck, an edge ring disposed around a perimeter of the electrostatic chuck and an upper electrode. At least one process gas source is coupled to at least one gas inlet of the plasma process chamber. An RF source is coupled to the electrostatic chuck and a controller is coupled to the RF source, the at least one process gas source and the plasma process chamber. The controller includes a cleaning recipe for forming a protective layer on a top surface of the electrostatic chuck, volatilizing etch byproducts deposited on one or more inner surfaces of the plasma process chamber, removing volatilized etch byproducts from the plasma process chamber and removing the protective layer from the top surface of the electrostatic chuck.

Yet another embodiment provides a waferless cleaning method for a capacitive coupled plasma system. The method includes forming a protective layer on a top surface of an electrostatic chuck including providing a process gas into the plasma process chamber, forming a plasma with the process gas and maintaining the electrostatic chuck at a temperature between about 40 and about 80 degrees C. less than an edge ring disposed around a perimeter of the electrostatic chuck. Etch byproducts deposited on an edge ring can be volatilized by maintaining the electrostatic chuck at a temperature of between about −40 to about 150 degrees C., while continuing to provide the process gas into the plasma process chamber and forming volatile compounds with the etch byproducts. The volatilized etch byproducts can be removed from the plasma process chamber and the protective layer can be removed from the top surface of the electrostatic chuck using an oxygen containing process gas.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for improved waferless auto clean process will now be described. It will be apparent to those skilled in the art that the present invention may be practiced without some or all of the specific details set forth herein.

Process chambers require periodic cleaning. In etch process chambers, there are several different levels of cleaning that are performed at different operational time intervals. One level of cleaning is referred to as waferless auto cleaning or WAC. Waferless auto cleaning is performed after the wafer has been removed and is used to remove etch byproduct deposits on one or more inner surfaces of the plasma process chamber. The waferless auto cleaning is performed after processing a selected number of wafers or even after every single wafer processing in the plasma processing chamber. More extensive cleaning and services are eventually required to remove deposits the any other auto cleaning process (e.g., covered wafer auto-cleaning) cannot remove effectively and to service various portions of the etch process chamber. This more extensive service includes opening and/or disassembly of the process chamber. Thus the extensive servicing is preferred to be delayed for as long as possible to maintain operational status of the etch process chamber. As a result the waferless auto cleaning must be as effective as possible.

Figure 1A:
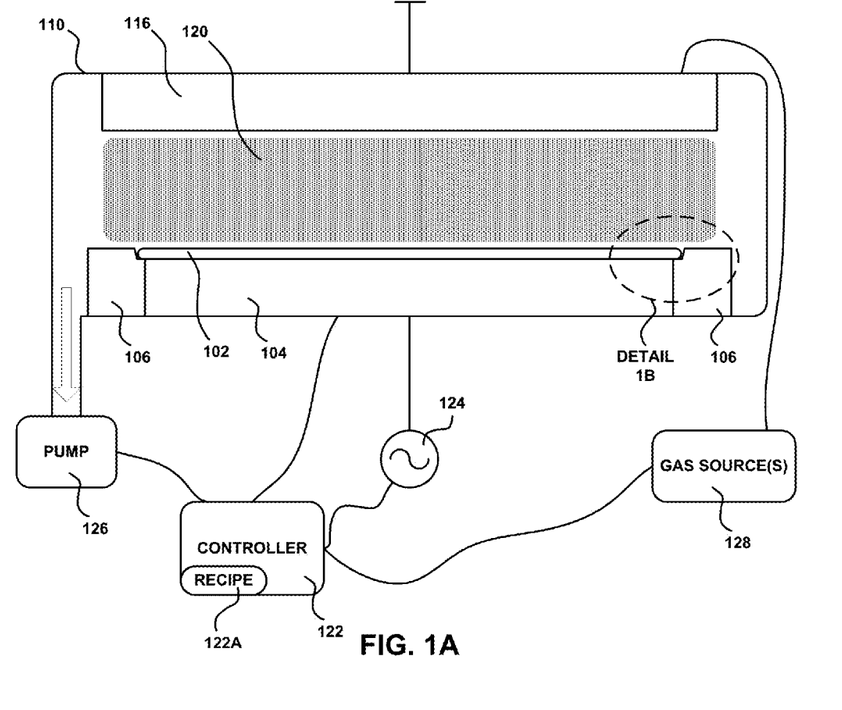
FIG. 1A is a capacitive coupled plasma processing system, for implementing embodiments of the present disclosure.

FIG. 1A is a capacitive coupled plasma processing system 100, for implementing embodiments of the present disclosure. The capacitive coupled plasma processing system 100 includes a plasma process chamber 110. A controller 122, an RF source 124, a pump 126 and one or more gas sources 128 are coupled to the plasma process chamber 110. The plasma process chamber 110 includes an electrostatic chuck 104 and an edge ring 106 for supporting a wafer 102 to be processed.

The RF source 124 can include multiple RF sources or a single RF source capable of producing multiple frequencies of the RF signals from between about 100 kHz to about 300 MHz. By way of example, some RF signals have frequencies of about 27 MHz to about 60 MHz. The RF signals can have an RF power of between about 50 w and about 10 kw. By way of example, between about 100 w and about 1500 w. The RF source 124 can produce pulsed or non-pulsed RF signals.

The controller 122 includes a processor, memory, software logic, hardware logic and input and output subsystems from communicating with, monitoring and controlling the capacitive coupled plasma processing system 100. The controller 122 also includes one or more recipes 122A including multiple set points various operating parameters (e.g., voltage, current, frequency, pressure, flowrate, power, temperature, etc.) for operating the capacitive coupled plasma processing system 100. The recipes 122A can include recipes for one or more embodiments of the improved waferless auto clean process described herein.

The plasma process chamber 110 also includes an upper electrode 116. In operation, the upper electrode 116 is typically grounded but could be biased or coupled to a second RF source (not shown). The RF source 124 provides an RF signal to the electrostatic chuck 104 and the gas sources 128 inject the desired process gas(es) into the chamber 110. A plasma 120 is then formed between the upper electrode 116 and the electrostatic chuck 104. The plasma 120 can be used to etch the surface 102A of the wafer 102 or volatilize deposits formed on various inner surfaces of the plasma process chamber 110.

Figure 1B:
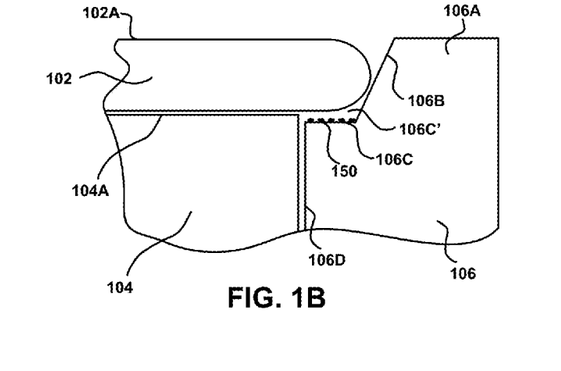
FIG. 1B is a detailed view of an edge portion of the wafer, for implementing embodiments of the present disclosure.

FIG. 1B is a detailed view of an edge portion of the wafer 102, for implementing embodiments of the present disclosure. An edge ring 106 surrounds the electrostatic chuck 104. A portion 106C of surface of the edge ring 106 extends under the edge of the wafer 102. The portion 106C of the edge ring 106 is separated from the bottom of the wafer 102 by a space 106C'. The space 106C' ensures that the electrostatic chuck 104 provides the bottom electrode for processing of the wafer 102. The space 106C' is not drawn to scale. The space 106C' is sufficiently large enough to electrically separate the wafer 102 and the portion 106C of surface of the edge ring 106 while also being small enough to substantially prevent plasma 120 from entering the space 106C'. Because the wafer 102 is supported by the electrostatic chuck 104, the RF power is driven through the electrostatic chuck and into the wafer.

During the etch process, etch byproducts 150 deposit on the inner surfaces of the plasma process chamber 110. The etch byproducts 150 can include polymeric residue, titanium and other metallic compounds and silicon compounds. The etch byproducts may deposit on any surface within the plasma processing chamber 110 where the plasma 120 disassociated process gas species may diffuse to, including the space 106C' and other inner surfaces of plasma process chamber.

Certain locations within the plasma process chamber 110 are more susceptible to etch byproduct accumulation. One location of interest is the wafer shadowed portion 106C of the edge ring 106. Portions 106A, 106B of the edge ring 106 are exposed to the plasma 120 and thus do not have the etch byproduct 150 accumulation as great as the portion 106C. Because the plasma 120 cannot enter the space 106C', the etch byproducts 150 can accumulate on portion 106C of the edge ring 106. Due to poor adhesion, thermal expansion and other forces, the etch byproducts 150 begin to flake off of the portion 106C causing particle issues on or near the edge of the wafer 102.

During waferless auto cleaning no wafer is present on the electrostatic chuck 104. Therefore, the waferless auto cleaning gas(es), RF power and chamber pressure must be very carefully controlled so as to prevent sputtering or sputtering aided etching to occur on the ceramic surface 104A of the electrostatic chuck. As a result, the etch byproduct deposits 150 on the portion 106C of the edge ring are not effectively etched during a typical waferless auto clean process. Further, typical O2 waferless auto clean processes will from non-volatile metal oxides and silicon oxides. The non-volatile metal oxides and silicon oxides cannot be removed by the typical O2 waferless auto clean process.

Figure 1C:
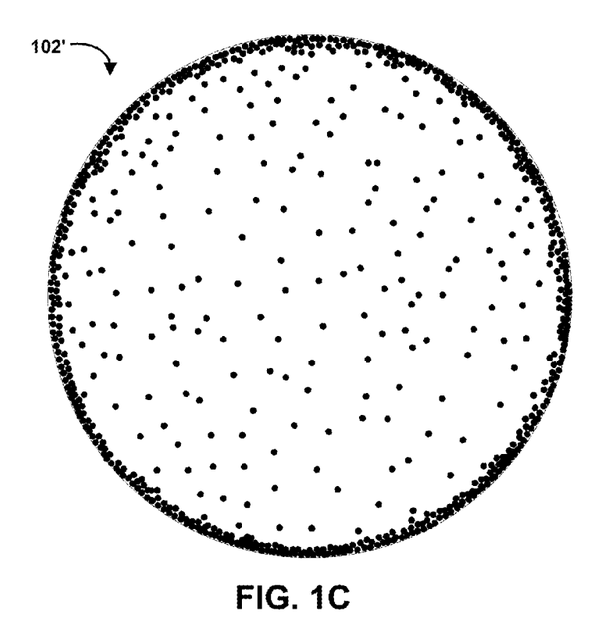
FIG. 1C is a compilation metrology scan of N number of wafers, for implementing embodiments of the present disclosure.

FIG. 1C is a compilation metrology scan 102' of N number of wafers 102, for implementing embodiments of the present disclosure. N number of wafers 102 are processed in the plasma process chamber 110 and corresponding metrology scans are performed on each of the wafers to quantify the number and distribution of particles occurring on the wafers. The compilation metrology scan 102' is useful to more clearly see locations where particles tend to occur on the wafers. As discussed above, the accumulated etch byproducts 150 begin to peel off the surface 106C of the edge ring 106 and conventional waferless auto cleaning processes are not sufficiently effective. As a result, particle issue occurs at the wafer edge as shown on the surface of the compilation metrology scan 102' of N number wafers 102.

Figure 1D:
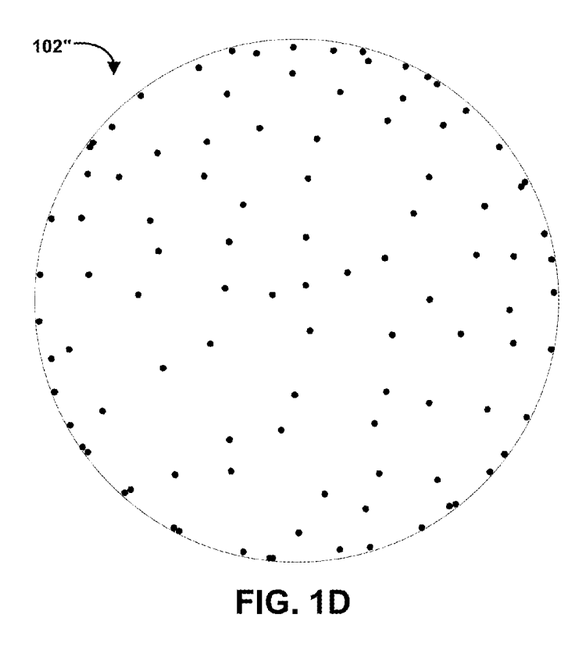
FIG. 1D is a preferable compilation metrology scan of N number of wafers in a process chamber implementing the improved cleaning process disclosed herein, for implementing embodiments of the present disclosure.

FIG. 1D is a preferable compilation metrology scan 102" of N number of wafers 102 in a process chamber implementing the improved cleaning process disclosed herein, for implementing embodiments of the present disclosure. The preferable compilation metrology scan 102" of N number of wafers 102 illustrates the reduced particle occurrences on the surface of the wafer 102 when the process chamber 110 is cleaned using the more effective waferless auto clean process described herein.

As discussed above, typical waferless auto clean chemistries include O2 waferless auto clean. O2 (oxygen) waferless auto clean is suitable to volatilize organic (carbon based) etch byproducts 150. However, since there is no volatile Ti compound containing oxygen, O2 waferless auto clean only make Ti-containing deposits less volatile and thus even harder to be removed. Typical O2 waferless auto clean is also relatively ineffective at volatilizing etch byproducts 150 containing silicon based compounds.

Another plasma process chamber 110 cleaning approach has been periodic cover-wafer auto cleaning. Waferless auto clean can be very difficult to select suitable gas/pressure/RF-power to effectively clean while also protecting the surface 104A of the electrostatic chuck 104 from being etched. Covering and protecting the electrostatic chuck 104 with a sacrificial wafer allows a significantly widened selection of etching chemical or chemicals, pressures and RF that are more effective with volatilizing etch byproducts 150 containing titanium, silicon and other metallic compounds. However, the sacrificial cover wafer still covers the portion 106C of the surfaces of the edge ring 106 and thus the particle source of main concern is not effectively cleaned with the cover-wafer auto cleaning.

A third approach has been to use a waferless auto clean chemistry involving chlorine and oxygen. Both Ti—Cl and Al—Cl compounds (e.g., titanium tetrachloride and aluminum trichloride), have sufficiently high vapor pressure and therefore can be easily pumped out of the plasma process chamber 110. When the amount of etch byproducts 150 is very small, such as on a heated edge ring 106, the Cl2-O2 waferless auto clean demonstrated some success. However, the reaction rate of chlorine towards the titanium deposits is very slow. When the amount of etch byproducts 150 is increased, such as when the edge ring temperature is close to the wafer process temperature, Cl2-O2 waferless auto clean completely failed provide effective cleaning results.

Further, chlorine based cleaning have many other problems. The chlorine can directly react with aluminum at high temperature, such as the aluminum parts in the upper electrode and in the gas delivery system coupled with the upper electrode and form relatively large quantities of AlCl3. It would be very difficult to sufficiently vaporize and evacuate/purge the AlCl3. The AlCl3 can also be a health and waster stream disposal issue. The chlorine based cleaning chemistries also have potential copper corrosion issues. The fluorine compound or compounds based cleaning do not react with the aluminum before plasma dissociation, and thus do not have the disadvantages as chlorine does.

One embodiment of an improved waferless auto clean uses a fluorine rich compound or compounds. A relatively carbon rich compound or compounds can be selected to form in-situ deposition on the surface 104A of the electrostatic chuck 104 to protect electrostatic chuck from being etched by the fluorine rich compound or compounds. Using the fluorine rich compound or compounds waferless auto clean is very effective for the all-in-one (AIO) metal-hard-mask (MHM) application to remove titanium containing etch byproducts and silicon based etch byproducts 150 in the otherwise wafer shadowed area on the edge ring 106.

Figure 2:
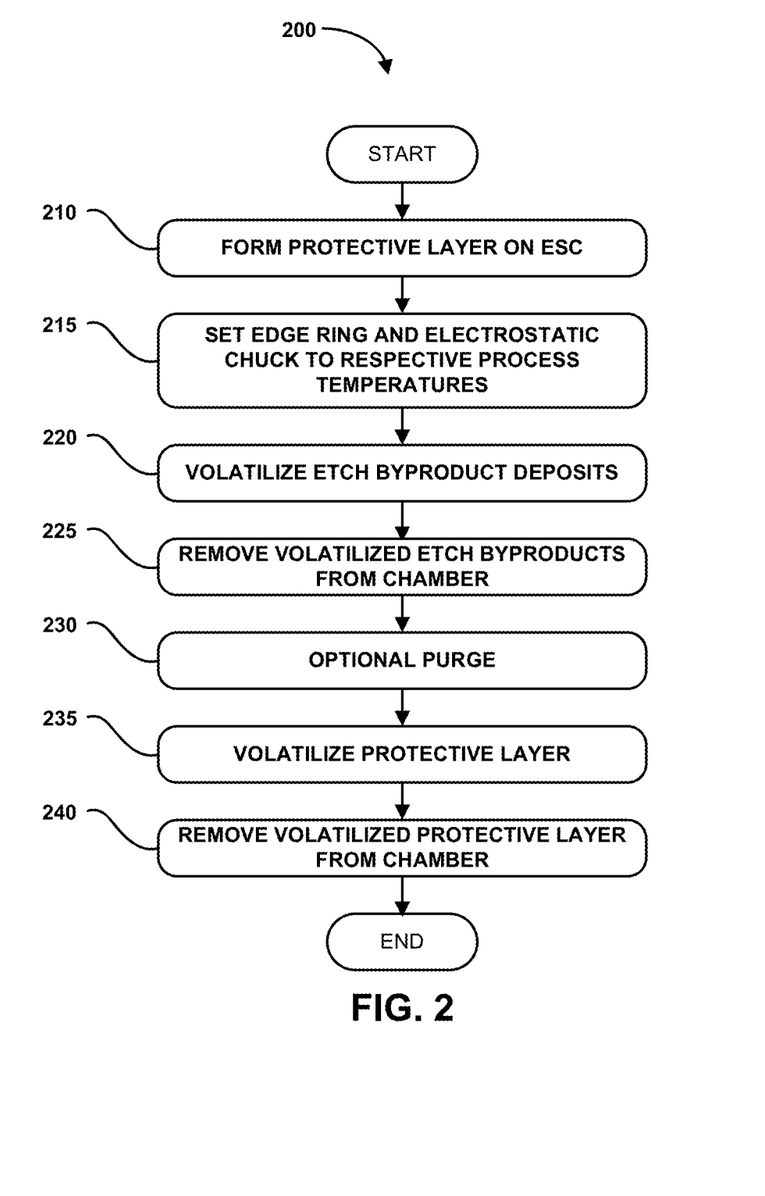
FIG. 2 is a flowchart diagram that illustrates the method operations performed in the improved waferless auto clean, for implementing embodiments of the present disclosure.

FIG. 2 is a flowchart diagram that illustrates the method operations 200 performed in the improved waferless auto clean, for implementing embodiments of the present disclosure. Any processed wafers are removed from the plasma process chamber 110 to prepare the plasma process chamber for the waferless auto cleaning process.

Figure 3A:
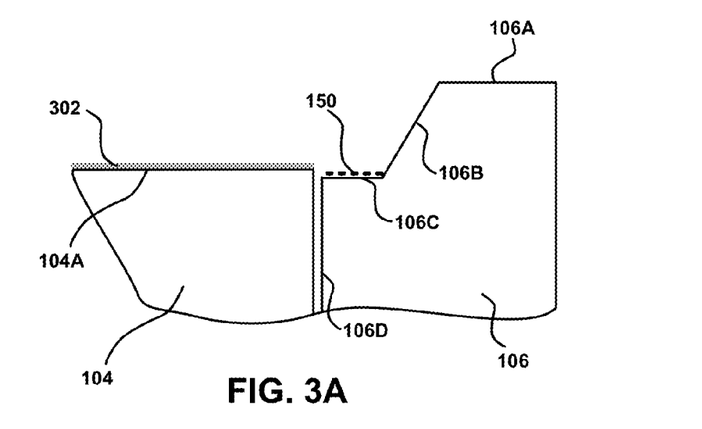
FIGS. 3A-C show a detail 1B portion of the electrostatic chuck and the edge ring, for implementing embodiments of the present disclosure.
Figure 3B:
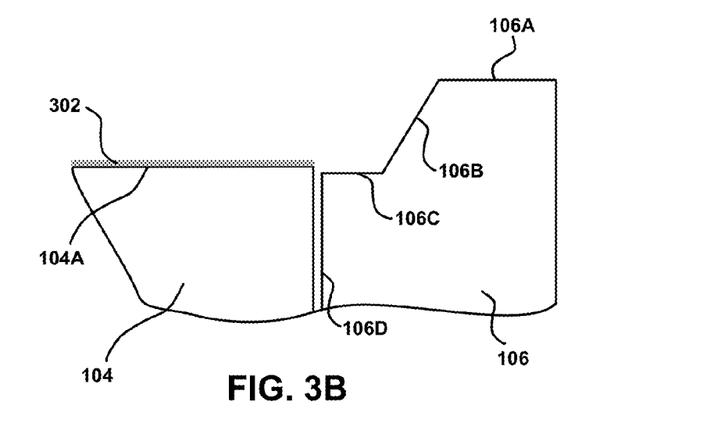
Figure 3C:
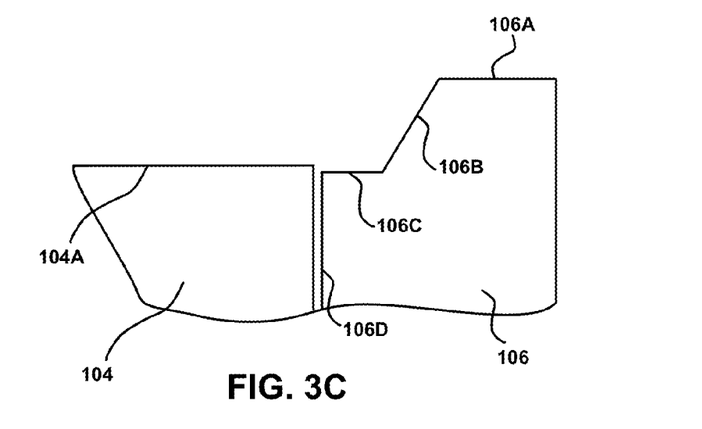

FIGS. 3A-C show a detail 1B portion of the electrostatic chuck 104 and the edge ring 106, for implementing embodiments of the present disclosure. In an operation 210, a protective layer 302 is formed on the surface 104A of the electrostatic chuck 104. Forming the protective layer 302 includes providing a selected process gas into the plasma process chamber 110, at a selected flowrate, concentration and pressure and applying a selected RF signal to form a plasma. The selected process gas can be one or more of CF4, C2F6, C2F4, C3F6, C4F10, CHF3, CH2F2, CF3Cl, and any other polymer forming etching gas, and combinations thereof, and combinations with other gases such as NF3, SF6, carried in a suitable carrier gas. Suitable carrier gases can include nitrogen, helium, neon argon and other suitable carrier gases and combinations thereof.

Providing the selected process gas can optionally include providing two or more process gases to the plasma process chamber 110. The two or more process gases can be provided in a serial or an overlapping manner. Providing the selected process gas can include providing a first process gas having a greater carbon to fluorine ratio than a second process gas and then providing the second process gas, each carried in a suitable carrier gas or gas mixture. The increased carbon to fluorine ratio of the first process gas tends to form the protective layer 302 more quickly than a process gas with a lesser carbon to fluorine ratio. By way of example, the first gas can be one or more of C2F4, C3F6, C3F8, C4F6, C4F8, CH3F, CH2F2 and other suitable polymer forming gases. The second gas can be one or more of CF4, C2F6, C2F4, C3F6, C4F10, CHF3, CH2F2, CF3Cl, NF3, SF6 and other suitable etchant gases.

Fluorine containing chemicals have long been used in the inductively coupled (ICP or TCP) plasma chambers without any issue, since there is no bias voltage on electrostatic chuck 104 in an ICP or TCP plasma chamber. Due to a non-zero bias voltage on the electrostatic chuck 104 in capacitive coupled plasma system, Al2O3 ceramic sputtering, and sputtering aided fluorine etching, can occur on the surface 104A to form non-volatile AlF3, thus resulting severe Al contamination and an additional particle source. The surface 104A of the electrostatic chuck 104 can be protected with the protective layer 302 to prevent the Al2O3 ceramic sputtering, and sputtering aided fluorine etching of the surface of the electrostatic chuck.

The first process gas can be provided to the plasma process chamber 110 for a first time interval. A second process gas can be provided to the plasma process chamber 110 for a second time interval. The second time interval can follow the first time interval such that the second process gas is provided after the first process gas is no longer provided to the plasma process chamber 110. Alternatively, the second time interval can overlap the first time interval such that the second process gas is provided to the plasma process chamber 110 during at least a portion of first time interval as the first gas is also being provided.

In an operation 215, the edge ring 106 is maintained at a temperature of between about 20 and about 200 degrees C. hotter than the electrostatic chuck 104 temperature. By way of example, the edge ring 106 can be maintained at a selected temperature of between about 40 and about 80 degrees C. hotter than the electrostatic chuck 104. The electrostatic chuck 104 can be maintained at a selected temperature of between about −40 and about 150 degrees C. (example: between about 20 and about 90 degrees C.). In at least one embodiment, the edge ring 106 can be maintained at a selected temperature of between about 50 and 150 degrees C. while the electro static chuck 104 is maintained at a cooler temperature than the edge ring. In an operation 220, the fluorine and/or chlorine from the disassociated selected process gas(es) reacts with the etch byproducts 150 on the inner surfaces of the plasma processing chamber 110 and specifically on the surfaces of the edge ring 106 such as portion 106C. The fluorine reaction with the etch byproducts 150 to produce one or more volatile compounds.

The plasma disassociates the selected process gas. At least a portion of the carbon from the selected process gas forms a carbon containing protective layer 302 on the cooler surface 104A of the electrostatic chuck 104. In an instance where the selected process gas is divided into a first process gas and a second process gas, plasma containing the first process gas, having a relatively greater carbon to fluorine ratio, tends to form the protective layer 302 at a faster rate than a plasma formed by the second process gas. Conversely, the plasma formed by the relatively lower carbon to fluorine ratio second process gas would tend to volatilize (i.e., form volatile compounds with) the byproduct deposits 150 at a faster rate than the relatively higher carbon to fluorine ratio first process gas.

The deposition and volatilization rates can be selected by adjusting chamber pressure, chemicals, chemical flow rates, chemical flow directions, RF frequencies, RF powers, and particularly the respective temperatures of the electrostatic chuck 104 and the edge ring 106 in the plasma process chamber 110. In locations inside the plasma process chamber 110 where the surface temperature is higher, etching/cleaning/volatilizing occurs, thus a heated edge ring 106 will be cleaned. In locations inside the plasma process chamber 110 where the surface temperature is sufficiently cool, deposition dominates and thus the protective layer 302 can be formed on the relatively cooler surface 104A of the electrostatic chuck 104.

As an example process the protective layer can be formed by providing the first process gas to the plasma process chamber 110 at a pressure of between about 200 mT and 8 Torr and applying an RF signal having a single or multiple frequencies equal to or greater than about 27 MHz and between about 150 w to about 2000 w. The RF signal can be a constant RF or can be a pulsed RF signal having a pulsing at a rate of between about 100 and about 5000 Hz, and a duty circle of 10% to 90%. The first process gas is provided with a carrier gas at a total flow rate of between about 400 sccm and about 8000 sccm. The first process gas can be between about 0.0 to 100 sccm in the total flow rate. The electrostatic chuck 104 can be maintained at a temperature of between about −40 to about 150 degrees C. The edge ring 106 is maintained at a temperature of between about 20 and about 200 degrees C. hotter than the temperature of the electrostatic chuck 104. In at least one embodiment, the edge ring 106 can be maintained at a temperature of between about 50 and 150 degrees C. while the electro static chuck 104 is maintained at a cooler temperature than the edge ring. The first process gas is provided to the plasma process chamber 110 for a first time period of between about 0 to about 20 seconds. It should be noted that providing the first process gas for a time of 0 seconds indicates skipping the optional process step of providing the first process gas.

Continuing the example, volatilizing the etch byproduct deposits 150 with the second process gas can include providing the second process gas to the plasma process chamber 110 at a pressure of between about 200 mT and 8 Torr and applying an RF signal having a single or multiple frequencies equal to or greater than about 27 MHz and between about 150 w to about 2000 w. The RF signal can be a constant RF or can be a pulsed RF signal having a pulsing at a rate of between about 100 and about 5000 Hz. The second process gas is provided with a carrier gas at a total flow rate of between about 400 sccm and about 8000 sccm. The second process gas can be between about 10.0 to 1000 sccm in the total flow rate. The electrostatic chuck 104 can be maintained at a temperature of between about −40 to about 150 degrees C. The edge ring 106 is maintained at a temperature of between about 20 and about 200 degrees C. hotter than the temperature of the electrostatic chuck 104. In at least one embodiment, the edge ring 106 can be maintained at a temperature of between about 50 and 150 degrees C. while the electro static chuck 104 is maintained at a cooler temperature than the edge ring. The second process gas is provided for a time period of between about 5 to about 1200 seconds.

In one embodiment, providing the first process gas is skipped (i.e., the first process gas is provided to the plasma process chamber 110 for a period of 0 seconds). The second process gas includes 500 sccm CF3H in a nitrogen carrier gas with a total flow rate of 2000 sccm is provided to the plasma process chamber 110. The plasma process chamber 110 is at a pressure of about 1000 mT. A 200 w, 30 MHz RF signal is applied to the plasma process chamber 110. The electrostatic chuck 104 temperature is set to 0 degrees C. and the edge ring 106 temperature is set to 150 degrees C. The second process gas is provided to the plasma process chamber 110 for 60 seconds. As described above, the protective layer 302 will be formed and the etch byproduct deposits 150 on the edge ring 106 can be volatilized.

In an operation 225, the volatilized compounds of the etch byproduct 150 deposits are removed from the plasma process chamber 110. Removing the volatilized compounds of the etch byproduct 150 deposits can be accomplished at substantially the same time as the operations 210-220 above.

Removing the volatilized compounds of the etch byproduct 150 deposits can include pumping the volatilized etch byproducts out of the plasma process chamber 110 using pump 126.

In an optional operation 230, the plasma process chamber 110 can be purged with an inert purge gas such as nitrogen, argon or helium to further purge the volatilized compounds of the etch byproduct 150 deposits and residual fluorine from the plasma process chamber. The optional purge can be a short as only a few seconds (e.g., less than about 6 seconds).

In an operation 235, an O2 waferless auto clean is performed to form volatile compounds of the carbon containing protective layer 302 from the surface 104A of the electrostatic chuck 104, as shown in FIG. 3C. The pump 126 can draw the volatilized compounds of the protective layer 302 out of the plasma process chamber 110 in an operation 240. The oxygen etch is substantially similar to a prior art O2 waferless auto clean, however can be of a much shorter duration than the typical 600 seconds duration of typical prior art O2 waferless auto clean. The method operations can then end.

The O2 waferless auto clean can include providing the O2 containing process gas (e.g., O2 or CO2, etc. and combinations thereof) at a pressure of between about 200 mT and 8 Torr and applying an RF signal having a single or multiple frequencies equal to or greater than about 27 MHz and between about 150 w to about 2000 w. The RF signal can be a constant RF or can be a pulsed RF signal having a pulsing at a rate of between about 100 and about 5000 Hz, and a duty circle of 10% to 90%. The 02 containing process gas is provided with a carrier gas at a total flow rate of between about 400 sccm and about 8000 sccm. The 02 containing process gas is between about 200 to 8000 sccm in the total flow rate. The electrostatic chuck 104 can be maintained at a temperature of between about −40 to about 150 degrees C. The edge ring 106 is maintained at a temperature of between about 20 and about 200 degrees C. hotter than the temperature of the electrostatic chuck 104. In at least one embodiment, the edge ring 106 can be maintained at a temperature of between about 50 and 150 degrees C. while the electro static chuck 104 is maintained at a cooler temperature than the edge ring. The second process gas is provided for a time period of between about 5 to about 1200 seconds.

In one embodiment, providing the O2 waferless auto clean includes providing 2500 sccm O2, with no carrier gas, to the plasma process chamber 110. The plasma process chamber 110 is at a pressure of about 1000 mT. A 400 w, 60 MHz RF signal is applied to the plasma process chamber 110. The electrostatic chuck 104 temperature is set to 60 degrees C. and the edge ring 106 temperature is set to 120 degrees C. The 02 waferless auto clean process gas is applied to the plasma process chamber 110 for 120 seconds. As described above, the protective layer 302 will be volatilized and removed from the plasma process chamber 110.

It should be noted that the first process gas, the second process gas, the carrier gas and/or the oxygen-containing gas can include other gases up to about 10% of the total gas flow. The other gas can include one or more of H2, He, O2, F2, Ne, Ar, Kr, Xe, CH4, C2H6 and other suitable etchant gases.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

The invention can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A waferless cleaning method for a plasma chamber that is configured as a capacitively coupled plasma system comprising:

setting a temperature difference between an electrostatic chuck and an edge ring that surrounds the electrostatic chuck of the plasma chamber, the temperature difference maintains the electrostatic chuck at a lower temperature than the edge ring that surrounds the electrostatic chuck;

generating plasma using a first process gas containing a carbon component and fluorine component, the plasma is configured to form a protective layer on a top surface of the electrostatic chuck and volatize etch byproducts formed on one or more inner surfaces of the plasma chamber from prior etch operations of a wafer, wherein the one or more inner surfaces of the plasma chamber include the edge ring that is maintained at the set temperature difference, the carbon component is configured to assist in the formation of the protective layer while the fluorine component is configured to assist in volatizing of the etch byproducts;

removing volatilized etch byproducts from the plasma chamber; and removing the protective layer from the top surface of the electrostatic chuck using a second process gas that includes oxygen or an oxygen containing compound;

wherein the temperature difference assists in protecting the top surface of the electrostatic chuck while removing the etch byproducts from a region of the edge ring.

2. The method of claim 1, wherein the temperature difference is between about 20 and about 200 degrees C.

3. The method of claim 1, wherein a temperature of the electrostatic chuck is set to be between about −40 to about 150 degrees C.

4. The method of claim 1,
wherein volatilizing etch byproducts deposited on the one or more inner surfaces of the plasma chamber further includes changing a ratio of said fluorine component to said carbon component to be lower during said volatizing of said etch byproducts, such that said carbon component in said ratio of said fluorine component to said carbon component is greater during a first time interval while generating of said plasma, such that formation of said protective layer over said electrostatic chuck is increased during said first time interval and said carbon component in said ratio is decreased during a second time interval while generating said plasma.

5. The method of claim 4, wherein providing the first process gas with the increased carbon component in said ratio is stopped when said first time interval ends before providing the first process gas with the decreased carbon component in said ratio.

6. The method of claim 4, wherein providing said first process gas with said increased carbon component in said ratio overlaps with providing the first process gas with said decreased carbon component in said ratio.

7. The method of claim 1, wherein removing the volatilized etch byproducts from the plasma chamber includes pumping the volatilized etch byproducts out of the plasma chamber using a pump coupled to an outlet of the plasma chamber.

8. The method of claim 1, wherein removing the volatilized etch byproducts from the plasma chamber includes purging the plasma chamber with a purge gas.

9. The method of claim 1, wherein removing the protective layer from the top surface of the electrostatic chuck includes
forming a volatile compound of the protective layer.

10. The method of claim 1, wherein the one or more inner surfaces of the plasma chamber includes one or more portions of the edge ring shadowed by a wafer that was previously processed in the plasma chamber.

11. A waferless cleaning method for a plasma chamber that is configured as a capacitively coupled plasma system, comprising:
setting a temperature difference between an electrostatic chuck and an edge ring that surrounds the electrostatic chuck of the plasma chamber, the temperature difference maintains the electrostatic chuck at a lower temperature than the edge ring that surrounds the electrostatic chuck by at least 20 degrees Celsius;

generating plasma using a first process gas containing a carbon component and fluorine component, the plasma is configured to form a protective layer in-situ on a top surface of the electrostatic chuck while volatilizing etch byproducts formed on the edge ring from prior etch operations of one or more wafers in the plasma chamber, wherein the, the carbon component is configured to assist in the formation of the protective layer while the fluorine component is configured to assist in volatizing of the etch byproducts from the edge ring;

removing volatilized etch byproducts from the plasma chamber; and removing the protective layer from the top surface of the electrostatic chuck using a second process gas that includes oxygen or an oxygen containing compound after generating the plasma with the first process gas;

wherein the temperature difference assists in protecting the top surface of the electrostatic chuck due to the in-situ formation of the protective layer while removing the etch byproducts from the edge ring.

12. The method of claim 11, wherein the temperature difference is up to 200 degrees Celsius.

13. The method of claim 11, wherein a temperature of the electrostatic chuck is set to be between about −40 degrees Celsius to about 150 degrees C.

14. The method of claim 11, wherein volatilizing etch byproducts deposited on the edge ring further includes changing a ratio of said fluorine component to said carbon component to be lower during said volatizing of said etch byproducts, such that said carbon component in said ratio of said fluorine component to said carbon component is greater during a first time interval while generating of said plasma, such that formation of said protective layer over said electrostatic chuck is increased during said first time interval and said carbon component in said ratio is decreased during a second time interval while generating said plasma.

15. The method of claim 14, wherein providing the first process gas with the increased carbon component in said ratio is stopped when said initial time interval ends before providing the first process gas with the decreased carbon component in said ratio.

16. The method of claim 14, wherein providing said first process gas with said increased carbon component in said ratio overlaps with providing the first process gas with said decreased carbon component in said ratio.

17. The method of claim 1, wherein removing the volatilized etch byproducts from the plasma chamber includes pumping the volatilized etch byproducts out of the plasma chamber using a pump coupled to an outlet of the plasma chamber.

18. The method of claim 1, wherein removing the volatilized etch byproducts from the plasma chamber includes purging the plasma chamber with a purge gas.

* * * * *